US 10,418,357 B2

(12) United States Patent
Han

(10) Patent No.: US 10,418,357 B2
(45) Date of Patent: Sep. 17, 2019

(54) PROTECTION CIRCUIT INCLUDING A PLURALITY OF PROTECTION TRANSISTORS

(71) Applicant: SK hynix Inc., Gyeonggi-do (KR)

(72) Inventor: Yun Soo Han, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 433 days.

(21) Appl. No.: 15/149,924

(22) Filed: May 9, 2016

(65) Prior Publication Data

US 2017/0155239 A1    Jun. 1, 2017

(30) Foreign Application Priority Data

Nov. 27, 2015 (KR) ........................ 10-2015-0167177

(51) Int. Cl.
*H02H 1/00*     (2006.01)
*H02H 7/20*     (2006.01)
*H01L 27/02*    (2006.01)

(52) U.S. Cl.
CPC ....... *H01L 27/0251* (2013.01); *H02H 1/0007* (2013.01); *H02H 7/20* (2013.01)

(58) Field of Classification Search
CPC ... H01L 23/5228; H01L 23/535; H01L 23/60; H01L 27/0248; H01L 27/0251; H01L 27/0266; H01L 27/027; H01L 27/0274; H01L 27/0285; H01L 27/0629; H01L 27/0802; H01L 27/11; H01L 27/1104; H01L 29/0649; H01L 29/0692; H01L 29/0847; H01L 29/1608; H01L 29/161; H01L 29/165; H01L 29/4238;

(Continued)

(56) References Cited

U.S. PATENT DOCUMENTS 6,075,285 A *  6/2000  Taylor ............... H01L 23/49822
                                                  257/691
6,239,614 B1 *  5/2001  Morikawa ........... H01L 27/0211
                                                  257/206

(Continued)

FOREIGN PATENT DOCUMENTS

CN         1992284        7/2007
CN         100468723      3/2009

(Continued)

*Primary Examiner* — Thienvu V Tran
*Assistant Examiner* — Nicolas Bellido
(74) *Attorney, Agent, or Firm* — IP & T Group LLP

(57) ABSTRACT

A protection circuit may include a first power line and a second power line, a plurality of high voltage interconnections, a plurality of low voltage interconnections, first and second pickup active regions, a high voltage protection transistor, and a low voltage protection transistor. The first power line and the second power line extending in parallel to each other while facing each other, and a plurality of high voltage interconnections are coupled to the first power line and extend toward the second power line while being spaced apart from each other. The plurality of low voltage interconnections are coupled to the second power line and extend toward the first power line while being spaced apart from each other. The first pickup active region extends across the plurality of high voltage interconnections and the second pickup active region extends across the plurality of low voltage interconnections.

16 Claims, 3 Drawing Sheets

(58) Field of Classification Search
CPC ....... H01L 29/435; H01L 29/49; H01L 29/78;
H01L 29/7848; H01L 2924/00; H01L
2924/0002; H01L 2924/3011; H01L
51/055; H02H 3/22; H02H 9/046; H02H
3/20; H02H 3/202; H02H 3/205; H02H
3/207; H02H 3/24; H02H 7/09; H02H
7/1252; H02H 9/00; H02H 9/04; H02H
9/042; H02H 9/06; H05K 1/0259; G05F
1/571; H03K 3/35625
USPC ....... 257/133, 140, 328, 334, 343, 355, 360,
257/364, 368, 401; 361/56, 90, 91.1, 111
See application file for complete search history.

(56) References Cited

U.S. PATENT DOCUMENTS

| | | | | |
|---|---|---|---|---|
| 6,914,305 | B2* | 7/2005 | Kwon | H01L 27/027 257/355 |
| 7,354,813 | B2* | 4/2008 | Kwon | H01L 27/027 438/197 |
| 10,121,882 | B1* | 11/2018 | Ho | H01L 29/0649 |
| 2003/0030484 | A1* | 2/2003 | Kang | H03K 3/012 327/544 |
| 2007/0063763 | A1* | 3/2007 | Yoo | G11C 11/4074 327/544 |
| 2007/0103195 | A1* | 5/2007 | Duk-Sohn | G11C 11/412 326/41 |
| 2008/0310061 | A1 | 12/2008 | Jeon et al. | |
| 2009/0184758 | A1* | 7/2009 | Motomura | H01L 27/092 327/544 |
| 2011/0254617 | A1* | 10/2011 | Ishii | G11C 5/06 327/543 |

FOREIGN PATENT DOCUMENTS

| | | |
|---|---|---|
| CN | 100580924 | 1/2010 |
| CN | 102683417 | 9/2012 |
| JP | 2011119415 | 6/2011 |
| KR | 100824775 | 4/2008 |
| KR | 101272762 | 6/2013 |

* cited by examiner

PROTECTION CIRCUIT INCLUDING A PLURALITY OF PROTECTION TRANSISTORS

CROSS-REFERENCES TO RELATED APPLICATION

The present application claims priority under 35 U.S.C. § 119(a) to Korean application number 10-2015-0167177, filed on Nov. 27, 2015, in the Korean Intellectual Property Office, which is incorporated herein by reference in its entirety.

BACKGROUND

1. Technical Field

Various embodiments generally relate to a protection circuit.

2. Related Art

As electronic apparatus may be provided with a protection circuit. The protection circuit detects a rapid change in a power supply voltage or a ground voltage and protects internal circuits. When the power supply voltage or the ground voltage is directly provided to transistors provided in the protection circuit, a leakage current may be generated due to electric over-stress.

SUMMARY

In a protection circuit according to various embodiments, a resistance component is arranged to a path through which a power supply voltage or a ground voltage is applied, so that electric over-stress is substantially prevented. The resistance component may utilize an arranged pickup active or may be arranged between interconnections.

In an embodiment, a protection circuit includes: a first power line and a second power line extending in parallel to each other while facing each other; a plurality of high voltage interconnections coupled to the first power line and extending toward the second power line while being spaced apart from each other; a plurality of low voltage interconnections coupled to the second power line and extending toward the first power line while being spaced apart from each other; a first pickup active region extending across the plurality of high voltage interconnections and a second pickup active region extending across the plurality of low voltage interconnections; a high voltage protection transistor arranged adjacent to the first power line and operating in response to a voltage provided from at least one of the plurality of low voltage interconnections through the second pickup active region; and a low voltage protection transistor arranged adjacent to the second power line and operating in response to a voltage provided from at least one of the plurality of high voltage interconnections through the first pickup active region.

In an embodiment, a protection circuit includes: a first power line and a second power line extending in parallel to each other while facing each other; complementary transistors arranged between the first power line and the second power line and serially coupled to each other; first and second protection transistors respectively coupled to source/drain regions, through which the complementary transistors are not coupled to each other, having gate regions adjacent to one of the first power line and the second power line, and receiving a voltage in the gate regions through interconnections extending to meet a remaining power line; and a plurality of resistance components formed at portions, at which interconnections for applying a voltage to gate regions of the first and second protection transistors have been temporarily cut, and coupling the interconnections to each other.

According to various embodiments, the protection circuit allows a power supply voltage and/or a ground voltage to be applied to protection transistors, which operate in response to the power supply voltage and the ground voltage, via resistance components. Consequently, it is possible to minimize a leakage current generated in the protection transistors.

According to various embodiments, in the protection circuit, resistance components may be added to a voltage applied to gate regions of protection transistors without appropriately changing an existing arrangement configuration.

DETAILED DESCRIPTION

Hereinafter, a protection circuit will be described below with reference to the accompanying drawings through various examples of embodiments.

Figure 1:
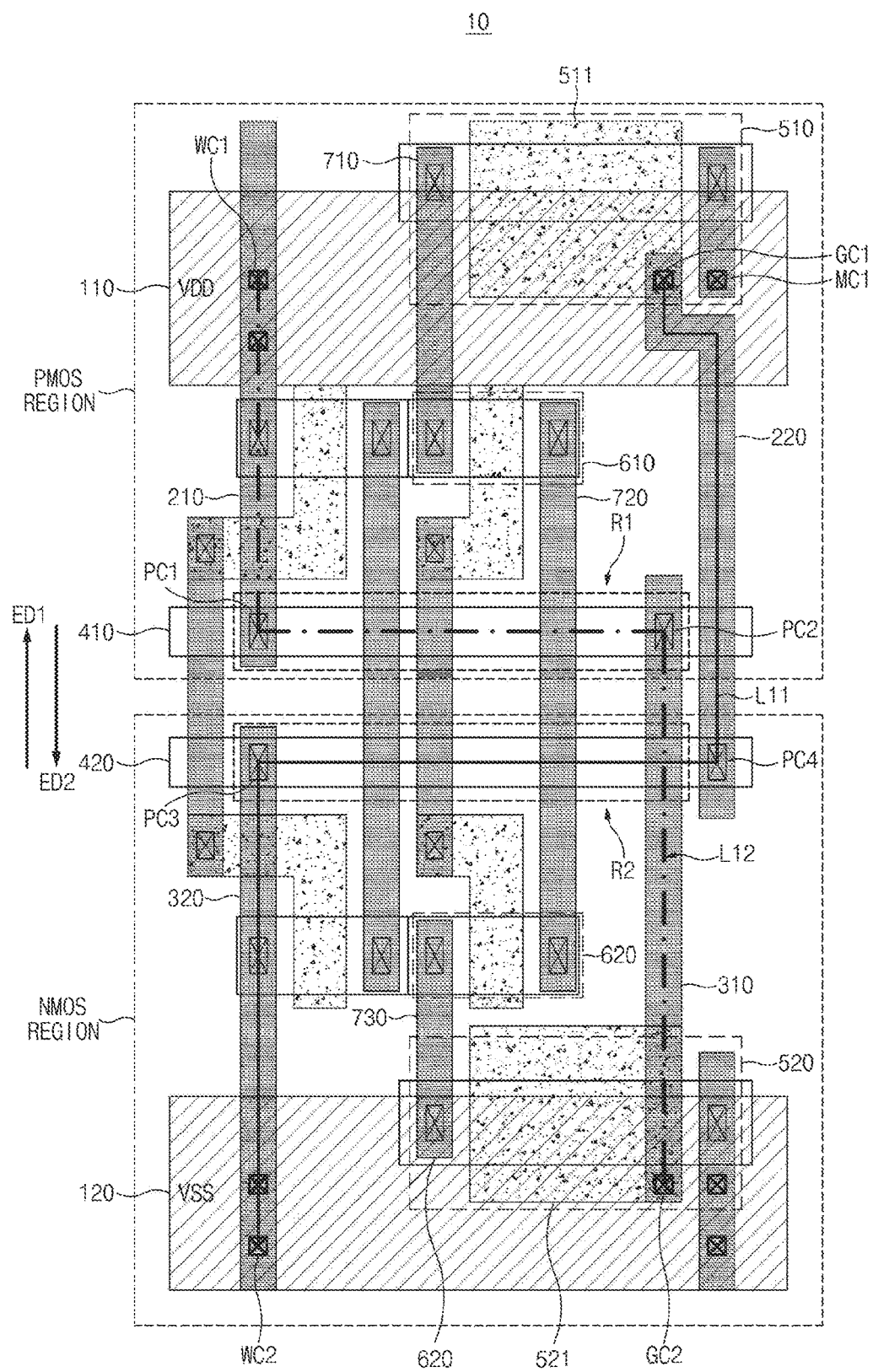
FIG. 1 is a plan view illustrating a protection circuit according to an embodiment.
Figure 2:
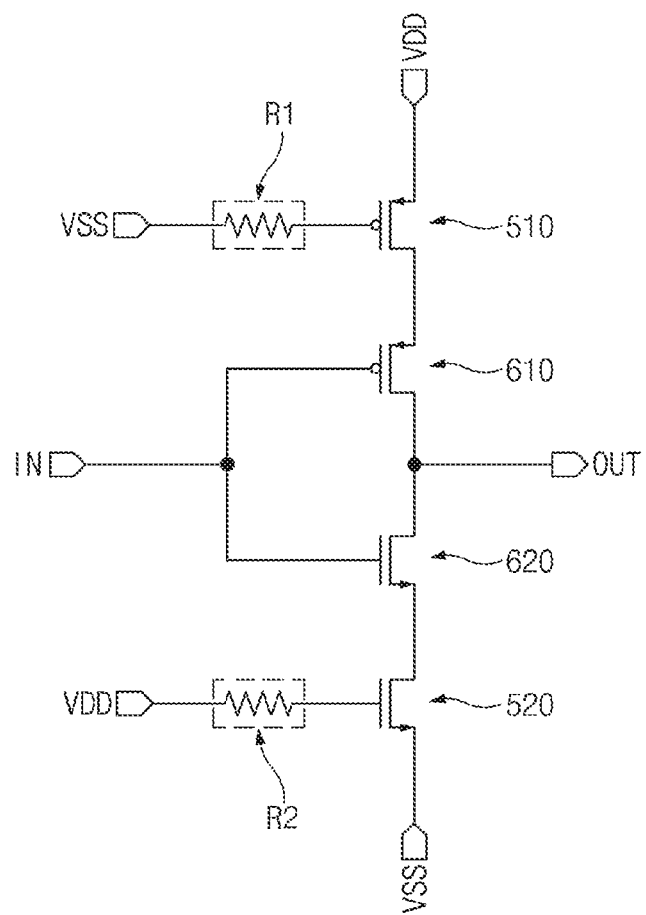
FIG. 2 is a circuit diagram illustrating a protection circuit according to an embodiment.

FIG. 1 is a plan view illustrating a protection circuit according to an embodiment and FIG. 2 is a circuit diagram illustrating the protection circuit according to an embodiment.

With reference to FIG. 1 and FIG. 2, a protection circuit according to an embodiment will be described.

Referring to FIG. 2, a protection circuit 10 may include a plurality of transistors 510, 610, 620, and 520 serially coupled to one another between a power supply voltage VDD and a ground voltage VSS.

The first protection transistor 510 is coupled between the power supply voltage VDD and a PMOS transistor (a pull-up transistor) and may operate in response to the ground voltage VSS. The second protection transistor 520 is coupled between the ground voltage VSS and a NMOS transistor (a pull-down transistor) and may operate in response to the power supply voltage VDD.

In an embodiment, resistance components R1 and R2 are added to paths through which the ground voltage VSS and the power supply voltage VDD are respectively applied to gates of the first and second protection transistors 510 and 520.

Between the first protection transistor 510 and the second protection transistor 520, the serially coupled complementary transistors 610 and 620 may be coupled. The complementary transistors 610 and 620 may respectively correspond to the PMOS transistor 610 and the NMOS transistor 620, and may receive substantially the same input signal IN through gates thereof and provide an output signal OUT through a terminal between the transistors.

Referring to FIG. 1, a first power line 110 and a second power line 120 extend in parallel to each other while facing each other. For example, the first power line 110 may provide the power supply voltage VDD and the second power line 120 may provide the ground voltage VSS.

Between the first power line 110 and the second power line 120, a plurality of transistors may be arranged. The first protection transistor 510 includes a gate region 511 adjacent to the first power line 110, wherein the gate region 511 may receive a voltage through a first interconnection path L11. Since the first protection transistor 510 is coupled to the power supply voltage VDD corresponding to a relatively high voltage, it may be called a high voltage protection transistor.

The second protection transistor 520 includes a gate region 521 adjacent to the second power line 120, wherein the gate region 521 may receive a voltage through a second interconnection path L12. Since the second protection transistor 520 is coupled to the ground voltage VSS corresponding to a relatively low voltage, it may be called a low voltage protection transistor.

The first and second interconnection paths L11 and L12 may be formed as follows.

A plurality of high voltage interconnections 210 and 220, which are coupled to the first power line 110 and extend toward the second power line 120 while being spaced apart from each other, are formed. According to an embodiment, the plurality of high voltage interconnections 210 and 220 extend toward the second power line 120, but may extend only to a length not reaching the second power line 120. For example, the plurality of high voltage interconnections 210 and 220 may extend in a direction crossing the extension directions of the first and second power lines 110 and 120, or a substantially perpendicular direction ED1.

Similarly, a plurality of low voltage interconnections 310 and 320, which are coupled to the second power line 120 and extend toward the first power line 110 while being spaced apart from each other, are formed. According to an embodiment, the plurality of low voltage interconnections 310 and 320 also extend toward the first power line 110, but may not reach the first power line 110. The plurality of low voltage interconnections 310 and 320 may extend in a direction crossing the extension directions of the first and second power lines 110 and 120, or a substantially perpendicular direction ED2.

A first pickup active region 410 may be formed to extend across the plurality of high voltage interconnections 210 and 220, and a second pickup active region 420 may be formed to extend across the plurality of low voltage interconnections 310 and 320. The pickup active regions 410 and 420 may be coupled to at least one of the plurality of high voltage interconnections 210 and 220 and at least one of the plurality of low voltage interconnections 310 and 320.

For example, the pickup active regions 410 and 420 may be coupled to at least one of the high voltage interconnections 210 and 220 and at least one of the low voltage interconnections 310 and 320 through pickup contacts PC1 to PC4.

As the pickup active regions 410 and 420 are coupled to the high voltage interconnections and the low voltage interconnections, the first protection transistor 510 may receive the ground voltage VSS through the first interconnection path L11 passing through the high voltage interconnection 220 coupled to the second pickup active region 420 across the second pickup active region 420 via the low voltage interconnection 320 coupled to the second power line 120.

The gate region 511 of the first protection transistor 510 may be coupled to the first high voltage interconnection 220 through a first contact GC1. The first high voltage interconnection 220 is coupled to the second pickup active region 420 through the fourth pickup contact PC4, is coupled to the second low voltage interconnection 320 through the third pickup contact PC3, and is finally coupled to the second power line 120 through a second power contact WC2.

The second protection transistor 520 receives the power supply voltage VDD through the second interconnection path L12 passing through the low voltage interconnection 310 coupled to the first pickup active region 410 across the first pickup active region 410 via the high voltage interconnection 210 coupled to the first power line 110.

The gate region 521 of the second protection transistor 520 may be coupled to the first low voltage interconnection 310 through a second contact GC2. The first low voltage interconnection 310 is coupled to the first pickup active region 410 through the second pickup contact PC2, is coupled to the second high voltage interconnection 210 through the first pickup contact PC1, and is finally coupled to the first power line 110 through a first power contact WC1.

In the first interconnection path L11, a region extending across the second pickup active region 420 serves as a resistance component R2, and in the second interconnection path L12, a region extending across the first pickup active region 410 serves as a resistance component R1. Accordingly, the first and second protection transistors 510 and 520 do not receive the ground voltage VSS and the power supply voltage VDD as is, but receive values passing through the resistance components R2 and R1. Consequently, it is possible to minimize a leakage current generated in the protection transistors 510 and 520.

The first protection transistor 510 may include a source region and a drain region, wherein the source region may be coupled to the first power line 110 via a first metal contact MC1 and the drain region may be coupled to a source region of a PMOS transistor 610 through a first metal interconnection 710.

The PMOS transistor 610 may include a source region coupled to the first protection transistor 510 and a drain region coupled to a drain region of a NMOS transistor 620 through a second metal interconnection 720. The NMOS transistor 620 may include a drain region coupled to the drain region of the PMOS transistor 610 and a source region coupled to a drain region of the second protection transistor 520 through a third metal interconnection 730. The second protection transistor 520 may include a source region coupled to the second power line 120.

The PMOS transistor 610 and the NMOS transistor 620 may share gate input for receiving the input signal N.

The metal interconnections 710, 720, and 730 serially coupling the transistors may extend substantially in parallel to the plurality of high voltage interconnections 210 and 220 and the plurality of low voltage interconnections 310 and 320.

According to an embodiment, the PMOS transistor 610 may be arranged between the first high voltage interconnection 220 and the second high voltage interconnection 210, and the NMOS transistor 620 may be arranged between the first low voltage interconnection 310 and the second low voltage interconnection 320.

According to an embodiment, the first protection transistor 510, the PMOS transistor 610, and the first pickup active region 410 may be arranged in a PMOS region, and the second protection transistor 520, the NMOS transistor 620, and the second pickup active region 420 may be arranged in a NMOS region.

Figure 3:
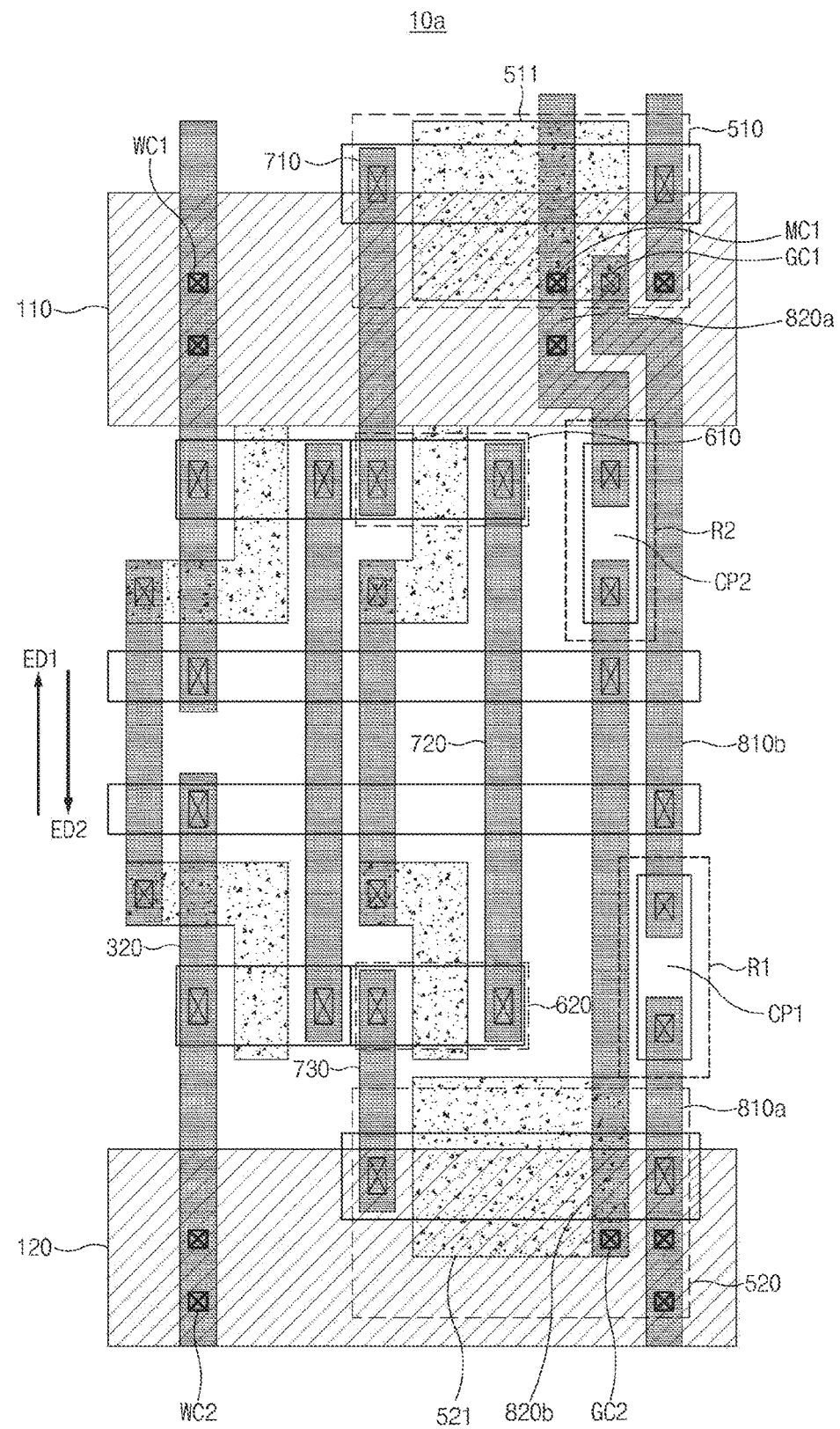
FIG. 3 is a plan view illustrating a protection circuit according to another embodiment.

FIG. 3 is a plan view illustrating a protection circuit according to another embodiment.

The plan view illustrated in FIG. 3 has substantially the same circuit configuration as the circuit diagram of FIG. 2, but a scheme of arranging resistance components is different from that of the protection circuit 10 of FIG. 1. The same reference numerals are used to designate the same elements, and a description thereof will be omitted in order to reduce redundancy.

Referring to FIG. 3, a protection circuit 10a may include a first power line 110 and a second power line 120 extending in parallel to each other while facing each other, complementary transistors 610 and 620 arranged between the first power line 110 and the second power line 120 and serially coupled to each other, first and second protection transistors 510 and 520, and a plurality of resistance components R1 and R2.

The first and second protection transistors 510 and 520 are respectively coupled to source/drain regions, through which the complementary transistors are not coupled to each other, have gate regions 511 and 521 adjacent to one of the first power line 110 and the second power line 120, and receive a voltage in the gate regions through protection interconnections extending to meet the other power line.

In detail, the first protection transistor 510 includes the gate region 511 adjacent to the first power line 110, and receives a voltage in the gate region 511 through first protection interconnections 810a and 810b extending to meet the second power line 120. The first protection interconnections 810a and 810b extend from the gate region 511 to the second power line 120 in the direction ED1, and have a cut portion CP1 at an intermediate part therebetween. The active resistor R1 is formed at the corresponding part, so that the ground voltage VSS is not applied to the gate region 511 of the first protection transistor 510 as is and a voltage having passed through the resistance component R1 may be applied thereto as illustrated in FIG. 2.

The second protection transistor 520 includes the gate region 21 adjacent to the second power line 120, and receives a voltage in the gate region 521 through second protection interconnections 820a and 820b extending to meet the first power line 110. The second protection interconnections 820a and 820b extend from the gate region 521 to the first power line 110 in the direction ED2, and are not continuous similarly to the first protection interconnections 810a and 810b. The active resistor R2 is formed at a cut portion CP2 of an intermediate part therebetween.

In the protection circuits according to the embodiments, resistance components may be added between gate regions of protection transistors and the power supply voltage VDD/ the ground voltage VSS applied to the gate regions through a change in interconnections without an increase in an arrangement area. Consequently, it is possible to substantially prevent defects due to electric over-stress generated when the power supply voltage VDD and the ground voltage VSS are directly applied to the gate regions.

While various embodiments have been described above, it will be understood to those skilled in the art that the embodiments described are by way of example only. Accordingly, the protection circuit described herein should not be limited based on the described embodiments.

What is claimed is:

1. A protection circuit comprising:
    a first power line and a second power line extending in parallel to each other while facing each other;
    a plurality of high voltage interconnections coupled to the first power line and extending toward the second power line while being spaced apart from each other;
    a plurality of low voltage interconnections coupled to the second power line and extending toward the first power line while being spaced apart from each other;
    a first pickup active region extending across the plurality of high voltage interconnections and a second pickup active region extending across the plurality of low voltage interconnections;
    a high voltage protection transistor arranged adjacent to the first power line and operating in response to a voltage provided from at least one of the plurality of low voltage interconnections through the second pickup active region; and
    a low voltage protection transistor arranged adjacent to the second power line and operating in response to a voltage provided from at least one of the plurality of high voltage interconnections through the first pickup active region,
    wherein the plurality of high voltage interconnections include a first high voltage interconnection coupled to a gate region of the high voltage protection transistor and a second high voltage interconnection coupled to a gate region of the low voltage protection transistor through the first pickup active region, and the plurality of low voltage interconnections include a first low voltage interconnection coupled to a gate region of the low voltage protection transistor and a second low voltage interconnection coupled to a gate region of the high voltage protection transistor through the second pickup active region.

2. The protection circuit of claim 1, wherein the high voltage protection transistor includes a gate region coupled to at least one of the plurality of high voltage interconnections coupled to the second pickup active region.

3. The protection circuit of claim 2, wherein a source region of the high voltage protection transistor is coupled to the first power line.

4. The protection circuit of claim 2, wherein the low voltage protection transistor includes a gate region coupled to at least one of the plurality of low voltage interconnections coupled to the first pickup active region.

5. The protection circuit of claim 4, wherein a source region of the low voltage protection transistor is coupled to the second power line.

6. The protection circuit of claim 4, wherein the plurality of high voltage and low voltage interconnections extend toward the power lines, but extend before reaching the power lines in extension directions.

7. The protection circuit of claim 1, wherein the protection circuit includes PMOS and NMOS transistors coupled between a drain region of the high voltage protection transistor and a drain region of the low voltage protection transistor.

8. The protection circuit of claim 7, wherein the PMOS transistor is arranged between the first high voltage interconnection and the second high voltage interconnection, and the NMOS transistor is arranged between the first low voltage interconnection and the second low voltage interconnection.

9. The protection circuit of claim 1, further comprising:
    a contact coupling the first pickup active region, the first low voltage interconnection, and the second high voltage interconnection to one another; and
    a contact coupling the second pickup active region, the first high voltage interconnection, and the second low voltage interconnection to one another.

10. The protection circuit of claim 4, wherein the first power line provides a power supply voltage and the second power line provides a ground voltage.

11. The protection circuit of claim 10, wherein the high voltage protection transistor corresponds to a PMOS transistor and the low voltage protection transistor corresponds to a NMOS transistor.

12. The protection circuit of claim 10, wherein the high voltage protection transistor and the first pickup active region are arranged in a PMOS region, and the low voltage protection transistor and the second pickup active region are arranged in a NMOS region.

13. A protection circuit comprising:
- a first power line and a second power line extending in parallel to each other while facing each other;
- complementary transistors arranged between the first power line and the second power line and serially coupled to each other;
- first and second protection transistors having gate regions adjacent to one of the first power line and the second power line, and receiving a voltage in the gate regions through interconnections extending to meet another power line; and
- a plurality of resistance components formed between the gate regions of the first or second protection transistor, and the first power line or the second power line,
- wherein the first protection transistor is coupled between a source region of a PMOS transistor and the first power line and operates in response to a voltage provided through an interconnection extending toward the second power line and a resistance component formed at a first cut portion of the interconnection.

14. The protection circuit of claim 13, wherein the first power line provides a power supply voltage and the second power line provides a ground voltage.

15. The protection circuit of claim 14, wherein the complementary transistors include the PMOS transistor arranged adjacent to the first power line and a NMOS transistor arranged adjacent to the second power line.

16. The protection circuit of claim 15, wherein the second protection transistor is coupled between a source region of the NMOS transistor and the second power line and operates in response to a voltage provided through an interconnection extending toward the first power line and a resistance component formed at a second cut portion of the interconnection.

* * * * *